United States Patent
Zeberoff et al.

(10) Patent No.: US 10,516,169 B2
(45) Date of Patent: Dec. 24, 2019

(54) APPARATUS AND METHOD FOR COATING BULK QUANTITIES OF SOLID PARTICLES

(71) Applicants: Anthony F. Zeberoff, Brookfield, CT (US); Jeffrey F. Roeder, Bethel, CT (US); Peter C. Van Buskirk, Newtown, CT (US)

(72) Inventors: Anthony F. Zeberoff, Brookfield, CT (US); Jeffrey F. Roeder, Bethel, CT (US); Peter C. Van Buskirk, Newtown, CT (US)

(73) Assignee: Sonata Scientific LLC, Bethel, CT (US)

( * ) Notice: Subject to any disclaimer, the term of this patent is extended or adjusted under 35 U.S.C. 154(b) by 249 days.

(21) Appl. No.: 15/350,010

(22) Filed: Nov. 12, 2016

(65) Prior Publication Data
US 2017/0137940 A1 May 18, 2017

Related U.S. Application Data

(60) Provisional application No. 62/254,431, filed on Nov. 12, 2015.

(51) Int. Cl.
*C23C 16/40* (2006.01)
*H01M 4/88* (2006.01)
(Continued)

(52) U.S. Cl.
CPC ........... *H01M 4/8867* (2013.01); *C04B 41/00* (2013.01); *C23C 16/40* (2013.01); *C23C 16/405* (2013.01);
(Continued)

(58) Field of Classification Search
CPC .......... C21C 16/45557; C23C 16/4412; C23C 16/40; C23C 16/405; C23C 16/4417; H01M 4/8867; H01M 2008/1293
See application file for complete search history.

(56) References Cited

U.S. PATENT DOCUMENTS 4,318,941 A * 3/1982 Gillett ....................... B05B 3/10
118/303
4,397,741 A * 8/1983 Miller ................... B03D 1/1425
209/170

(Continued)

OTHER PUBLICATIONS

J.A. McCormick, B.L. Cloutier, A.W. Weimer, S.M. George, Rotary reactor for atomic layer deposition on large quantities of nanoparticles, J. Vac. Sci. Technol. A, Jan./Feb. 2007, 67-74, vol. 25A (1).

(Continued)

*Primary Examiner* — Cynthia H Kelly
*Assistant Examiner* — Monique M Wills
(74) *Attorney, Agent, or Firm* — Gregory Stauf (57) ABSTRACT

An apparatus and method is described to coat small and large quantities of solid particles using atomic layer deposition, with increased material utilization and decreased cycle times. The resulting higher coating efficiency ALD process is achieved by a controlled pressure differential acting across a rotating porous vessel that contains a plurality of solid particles. The apparatus is comprised of two coaxial cylindrical porous vessels with a means for one to rotate, and a two stage rotary feedthrough with a specialized hollowed out shaft, which enables both rotation of the vessel and reactant, purge, and product gas transport across a particle bed that undergoes mixing.

25 Claims, 3 Drawing Sheets

(51) Int. Cl.
*C23C 16/455* (2006.01)
*C23C 16/44* (2006.01)
*C04B 41/00* (2006.01)
H01M 8/124 (2016.01)
H01M 4/90 (2006.01)

(52) U.S. Cl.
CPC ...... *C23C 16/4412* (2013.01); *C23C 16/4417* (2013.01); *C23C 16/45548* (2013.01); *C23C 16/45555* (2013.01); *C23C 16/45557* (2013.01); *H01M 4/9033* (2013.01); *H01M 2008/1293* (2013.01)

(56) References Cited

U.S. PATENT DOCUMENTS

| | | | |
|---|---|---|---|
| 6,913,827 B2 | 6/2005 | George et al. | |
| 2008/0113197 A1* | 5/2008 | Littman | B01J 2/006 428/407 |
| 2013/0059073 A1 | 3/2013 | Jiang | |
| 2017/0018782 A1* | 1/2017 | Roeder | H01M 4/9033 |

OTHER PUBLICATIONS

Jacqueline S. Wrench, Kate Black, Helen C. Aspinall, Anthony C. Jones, John Basca, Paul R. Chalker, Peter J. King, Matthew Werner, Hywel O. Davies, and Peter N. Heys, MOCVD and ALD of CeO2 Thin Films using a Novel Monomeric CeIV Alkoxide Precursor, Chem. Vap. Deposition, 2009, 259-261, vol. 15.

Chen-Long Duan, Xiao Liu, Bin Shan, Rong Chen, Fluidized bed coupled rotary reactor for nanoparticles coating via atomic layer deposition, Rev. Sci. Instrum. 2015, 075101, vol. 86.

Chen-Long Duan and Rong Chen, A Rotation Fluidization Coupled Atomic Layer Deposition Reactor for Nanoparticle Coating, ECS Trans. 2016, 69-75, vol. 75 (6).

Nakamura, Hideya, Watano, Satoru, Fundamental particle fluidization behavior and handling of nano-particles in a rotating fluidized bed, Powder Technology, 2007, 324, 183.

Quevedo, Jose; Pfeffer, Robert; Shen, Yueyang; Dave, Rajesh; Nakamura, Hideya; Watano, Satoru, Fluidization of Nanoagglomerates in a Rotating Fluidized Bed, AIChE Journal, 2006, 2401, 52(7).

Watano, Satoru; Nakamura, Hideya; Hamada, Kenji; Wakamatsu, Yoshihiro; Tanabe, Yoshiaki; Dave, Rajesh; Pfeffer, Fine particle coating by a novel rotating fluidized bed reactor, Powder Technology, 2004, 172, 141.

* cited by examiner

| ALD Precursor Flow Rates and ALD cycle Times | | | |
|---|---|---|---|
| Driving Force | ΔP (torr) | Flow rate, Q (cm³/s) | Time to coat 10 g (s) |
| Molecular Diffusion | 0 | 1 | 68832 |
| Differential Pressure | 0.1 | 30 | 12.34 |
| | 0.5 | 140 | 2.54 |
| | 1 | 285 | 1.28 |
| | 3 | 850 | 0.43 |
| | 5 | 1410 | 0.26 |

APPARATUS AND METHOD FOR COATING BULK QUANTITIES OF SOLID PARTICLES

This invention was made with Government support under contract SC-0013116 awarded by the U.S. Department of Energy. The Government has certain rights in this invention.

CROSS REFERENCE TO RELATED APPLICATIONS

U.S. Provisional Patent Application 62/254,431, filed Nov. 12, 2015.

BACKGROUND OF THE INVENTION

References

See IDS filed with this application, as well as "Surface Modified Cathode Particles and Method of Making Same", Provisional application No. 62/192,033, filed Jul. 13, 2015, and "Dual Conductor Surface Modified Cathode Particles and Method of Making Same, Provisional Application No. 62/265,076, filed Dec. 9, 2015.

SUMMARY DISCLOSURE OF INVENTION

The present invention relates to an efficient and improved atomic layer deposition process for developing ultrathin, uniform and conformal coatings on bulk quantities of solid particles. Specifically, within two coupled vacuum chambers, an arrangement and method is provided that introduces a differential pressure acting across a porous walled vessel containing the said solid particles. This differential pressure enables reactant/purge gases to rapidly enter the vessel and product/purge gases to exit the vessel.

Description of the Related Art

Employing nanometer level thicknesses of films or particles on the surface of micro/nano-particles represents a novel method to engineer advanced materials for fuel cells, photovoltaics, semiconductors, light emitting diodes, catalysts, photocatalysts, and many other technologies. Although commercial systems that use atomic layer deposition (ALD) as the primary coating method are starting to be deployed, significant improvements are needed. Industrial scale coating of particles using ALD requires process times and feed material usage efficiencies similar to non ALD deposition systems that coat particles on the order of tens to hundreds of kilograms per day.

ALD is a vapor phase deposition process whereby coatings on the surface of a substrate material can be made with atomic level precision. A single layer coating is achieved in a two-step chemical reaction process. The precursor material is first introduced into a controlled atmosphere chamber containing the substrate(s) to be coated. Reactive chemical groups attached to the precursor react with terminal chemical groups on the surface of the substrate, leaving behind the chemisorbed precursor. Several head groups remain on the chemisorbed precursor, which must undergo a ligand exchange in order to react with a successive dose of precursor material. The second chemical reaction is due to a co-reactant dose introduced into the chamber, which reacts with the remaining head groups and thereby forming the first layer. In contrast to a continuous vapor deposition process, e.g., chemical vapor deposition (CVD), ALD requires that these two steps be temporally separated, i.e. performed sequentially such that the reactants are not exposed to each other in the gas phase. Therefore, an inert purge is generally introduced between alternating doses of chemical precursor and co-reactant. The ALD process forms a uniform layer on the substrate provided that the amount of precursor and co-reactant is equal to or greater than the number of reactive sites on the substrate, a so-called saturated dose. As an alternative to a saturated dose, an undersaturated dose can leave islands or particles on the substrate surface. This process can be repeated successively to achieve films or islands of a desired thickness.

ALD techniques to coat the surface of particles with precise, ultrathin and conformal coatings have been examined for applications that benefit from surface modified particles with specific volume and surface properties. Such particles are often termed core-shell structures. Examples include various types of core materials, e.g., metals, oxides, nitrides, mixed alloys, and polymers that may be coated with the same or different type of material.

There are two primary considerations for economic ALD coating of solid particles: 1) the time required to coat the particles, and 2) the amount of precursor and co-reactant used in order to establish a desired coating. It is therefore important to minimize the cycle time of each ALD cycle. For simple planar surfaces, the completeness of saturation or reaction of the adsorbed monolayer may be experimentally determined, and the process pressure, flow rates and substrate temperature can be established accordingly.

ALD deposition on powders is a more complicated challenge, because of considerably longer time constants associated with saturation and reaction of the ALD monolayers. These times may be 10× or 100× the times associated with ALD on planar surfaces. In order to temporally segregate the ALD steps to an adequate degree, multistep deposition sub-cycles, longer purge times, high purge flow rates and inter-cycle vacuum steps may be employed. ALD process tools all tend to sweep reactants into and out of the collection of powder particles that comprises the substrate, and excessive movement of these particles may be highly likely.

Therefore the ALD particle coating apparatus and operational methodology should prevent particles from escaping the reactor volume during dose/purge periods; the method and apparatus should ensure frequent and continual contact between the particles and reactants during the respective portions of the ALD cycle; and the method and apparatus should enable rapid gas transport between the reactor volume and gas inlet and pumping outlet ports.

In well-known Prior Art, McCormick et al, "Rotary reactor for atomic layer deposition on large quantities of nanoparticles", reported ALD on particles utilizing high ALD cycle times, e.g. 6 minutes per layer. This apparatus consists of a rotating porous tube within a vacuum chamber. Precursor, co-reactant, and purge gases are introduced into the vacuum chamber. The porous tube contains the particles and is aligned along a horizontal axis in the chamber and is rotated at such a speed that permits the particles to be periodically suspended during each rotation of the vessel, which enables effective agitation and therefore promotes contact between the particles and reactant gases. This rotating vessel methodology is an attractive alternative to fluidized bed process, which require higher precursor gas flows to suspend the particles, and which may pass by the particles with only a fraction of the precursor molecules being adsorbed onto the particle surfaces, thereby using a larger amount of precursor. The pores in the tube enable diffusion and exchange of gases between the inside of the tube and vacuum chamber. Despite its success in achieving conformal films on particles, this apparatus and process is limited due to molecular diffusion alone as the driving force in getting gases into and out of the porous tube, and therefore requiring a longer process time to coat all the particles. McCormick et al acknowledge this limitation in that the gas doses may be applied at significantly higher pressure (on the order of 1-30 Torr) during the beginning of the dose where the dose is allowed to enter the reactor at a state of comparatively reduced pressure (<<1 Torr). This method, which we term a pressure spike, effectively creates a momentary pressure differential across the walls of the porous vessel due to the conductance limiting nature of the porous vessel walls that limit gas flow and create a transient pressure differential that helps drive the gas through the porous wall. Although this pressure spike creates a pressure differential, the effect is transient. Furthermore, the high pressure condition may be undesirable for ALD precursors that are prone to premature decomposition or deleterious gas phase reactions, such as oligimerization, which may compromise the ALD behavior of the precursor. Such reactions become more problematic as gas pressure increases (e.g., a 10 vs. 1 Torr process) because the mean free path between precursor molecules decreases with increasing pressure and collisions between precursor molecules become much more likely. Although some ALD precursors such as trimethylaluminum (TMA) may be robust with respect to gas phase collisions, many others are much less tolerant of higher process pressures, for example, rare earth precursors based on cyclopentadienyls such as tri-sisoplropylcyclopentadienyl cerium [$Ce(iPrCp)_3$] or tri-sisoplropylcyclopentadienyl gadolinium [$Gd(iPrCp)_3$] are prone to oligimerization. Numerous other precursors have this tendency, e.g., transition metal amides, and therefore a process/apparatus that avoids this allows many more useful materials to be deposited by ALD.

In another instance of possible Prior Art, U.S. patent Application 20130059073 A1 describes a rotary vessel containing a mass of solid particles whereby reactant gases are introduced into the vessel through a hollow tube while product gases escape in an adjacent concentric tube. This method of coating particles requires that the rotational axis of the rotary vessel be deviated from the horizontal axis, so that particles do not escape at the outlet port. Rotating the vessel in this fashion limits the ability for the particles to be fully suspended upon each rotational period, which results in a decrease in the contact frequency particles make with the product gas, and therefore requires a longer process time to coat all the particles.

Accordingly, it would be significantly advantageous to improve the ALD reactor geometry and design, such that particles may be effectively confined and uniformly coated, with reduced use of pressure spikes, and with reduced process time and effective usage of the precursor/co-reactant feed materials under conditions most favorable to the intrinsic properties of the precursor species.

The present invention relates to an improved highly controlled atomic layer deposition process for efficiently coating the surface of solid particles in a bulk quantity.

In one aspect, the invention relates to the use of atomic layer deposition to deposit a coating on the surface of solid particles.

In another aspect, the invention relates to the implementation of a differential pressure acting across a two layer concentrically hollowed (porous) tube-vessel arrangement.

In another aspect, the invention relates to rotation of the tube-vessel arrangement, whereby the rotary shaft is the hollow tube.

In yet another aspect, the invention relates to a dual feed through mechanism enabling both a vacuum seal with the rotary shaft and gas transport.

BRIEF DESCRIPTION OF THE DRAWINGS

FIG. 1 is a cross section of the apparatus. A primary vacuum chamber 1 houses a hollowed porous walled vessel 2 containing an inner hollow tube connected to a dual rotary feedthrough 3 with an end pulley or drive attachment 4. The left and right rotary vacuum feedthroughs comprise the dual rotary feedthrough 3. A secondary vacuum chamber 5 is separated from the primary vacuum chamber 1 by one of the dual rotary vacuum feedthoughs 3 disposed between the two vacuum chambers. Note that in the context of this patent, while in a preferred embodiment a vacuum chamber is operating at below atmospheric pressure, it may be near, at or above atmospheric pressure, so long as it provides a controlled atmosphere.

DETAILED DESCRIPTION OF THE INVENTION, AND PREFERRED EMBODIMENTS THEREOF

The present invention relates to an improved apparatus that enables efficient ALD coating on the surface of bulk solid particles. Solid state hollow particles or moderate or high surface area catalyst particles or extrudates may also be coated using the disclosed invention. Particles may include various types of materials: metals (e.g. Al, Mg, Ti, Fe, Cr, Co, Ni, Cu, Zr, Hf, W, Te, Se and alloys thereof) oxides (silica, alumina, ceria, titania, zirconia, magnesia, iron oxide, cobalt oxide, strontium oxide, manganese oxide, lead oxide, bismuth oxide, tantalum oxide, niobium oxide, and mixtures thereof), nitrides ($Si_3N_4$, AlN, TiN, ZrN, HfN, WN), carbon (graphitic, $C_{60}$ fullerene), pharmaceutical compounds, and polymers (e.g., polystyrene, polycarbonate, polymethylmethacrylate, acetyl, etc.) Coatings may include various types of materials: metals (e.g. Al, Mg, Ti, Fe, Cr, Co, Ni, Cu, Zr, Hf, W, Te, Se and alloys thereof) oxides (silica, alumina, ceria, titania, zirconia, magnesia, iron oxide, cobalt oxide, strontium oxide, manganese oxide, lead oxide, bismuth oxide, tantalum oxide, niobium oxide, and mixtures thereof), nitrides ($Si_3N_4$, AlN, TiN, ZrN, HfN, WN), flourides (CaF, MgF, AlF), carbon (graphitic, $C_{60}$ fullerene), alucones, silicones, and polymers (e.g., polystyrene, polycarbonate, polymethylmethacrylate, acetyl, etc.)

The primary objectives of the present invention is to coat the particles as fast as possible, to use an amount of feed/precursor material as close as possible to the stoichiometric amount (i.e., to minimize the loss of unreacted feed material), and to retain near 100% of the original solid particle loading at the end of the deposition process. This is accomplished with relatively low pressure differentials (less than several Torr, and as low as 0.1 Torr) which may be set independently of absolute process pressures, thus avoiding high pressures (10's of Torr) that may degrade the precursors.

As mentioned earlier, the ALD process uses pulses of a precursor reactant and a co-reactant. The pulses are separated by pulses of inert gas to prevent reaction in the gas phase. A series of pulses characterized by a precursor dose pulse, purge pulse, co-reactant pulse, and purge pulse is known as an ALD cycle.

Figure 1:
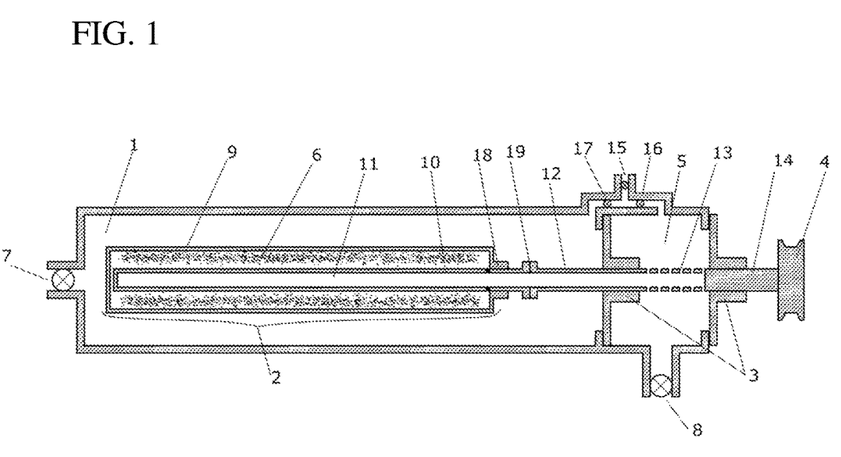

The key feature of the invention that enables high coating efficiencies in the present invention is the ability to impart and maintain a controlled pressure difference acting across a horizontally oriented rotating porous vessel 2 which contains a plurality of particles 6. This is distinguished to a previous method where gas conducted inside the vessel by molecular diffusion alone, which is a much slower process than forced gas flow, or by a pressure spike, which may have deleterious effects on the precursor. The end face of the inner tube 10 of the porous vessel 2 is solid. If porous, the inner tube has a terminating end separated from the outer tube as shown in FIG. 1. The sealed end of the inner tube 10 may share the end face of the porous vessel 2. The end face of the outside of the porous vessel 2 may be solid. Note that while inner tube 10 is shown as cylindrical and generally extending coaxially with the rotation axis of the vessel 2, it may have other shapes, such as, but not limited to, a spherical or square cross section, and the term "tube" is intended to cover these other shapes as well. Similarly, porous vessel 2 may have other shapes than cylindrical.

Figure 3:
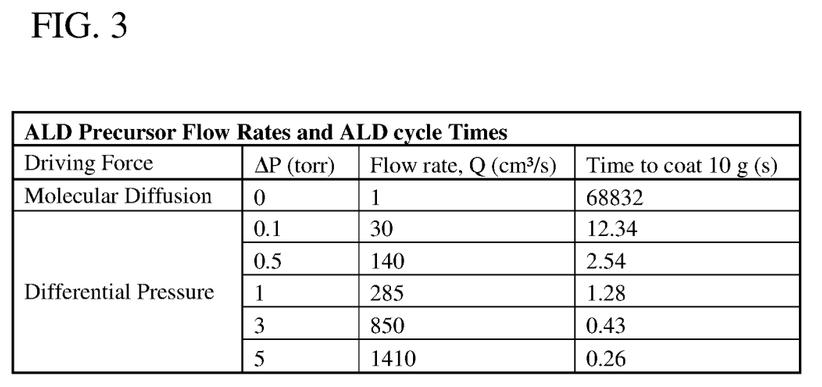
FIG. 3 compares molecular diffusion flow to differential pressure flow of the subject invention, for a single saturating ALD dose of precursor gas. The pressure differential, $\Delta P$, represents the pressure gradient across the wall of the porous vessel. The flow rate, Q, represents the flow rate across the wall of the porous vessel.

Calculations shown in FIG. 3 (Table 1) indicate that the present invention can increase the gas flow rate into the vessel by many orders of magnitude compared with molecular diffusion, dramatically reducing process times. For the instance where molecular diffusion is the driving force that delivers precursor through the porous wall and into the cavity of the vessel, the governing equation is:

$$Q(m^3/s) = \frac{4}{3}\sqrt{\frac{2\pi RT}{M}} \cdot \frac{s^3}{l} \cdot n_p,$$

where C is the flow rate, R is the gas constant, T is the temperature, M is the molecular mass of the gas species, s is the pore radius, l is the length of the pore, and $n_p$ is the total number of pores in the vessel. For the case of a differential pressure, the governing equation is known as Darcy's Law:

$$Q(m^3/s) = \frac{k \cdot A \cdot \Delta P}{\mu L},$$

where k is the intrinsic permeability of the porous media, A is the cross-sectional area to flow, $\Delta P$ is the pressure drop across the porous media, $\mu$ is the viscosity of the fluid, and L is the length of the porous media. In FIG. 3 (Table 1), these two equations are used to compare values for molecular diffusion and differential pressure for precursor gas entering the vessel. Assumptions are made on the values of the viscosity of the gas ($2.6 \times 10^{-5}$ Pa-sec) and the intrinsic permeability ($3.7 \times 10^{-3}$ m$^{-2}$) of the porous vessel. Additionally, in FIG. 3 (Table 1), the time required to saturate the surface of solid particles of a particular mass, 10 grams, is illustrated. It is clear that with increased pressure gradients across the wall of the porous vessel, the time required to coat a mass of solid particles is significantly decreased.

To illustrate the apparatus's general operation, a differential pressure acting across the inner and outer walls of the porous vessel is established by controlling vacuum pressures at the primary 7 and secondary exhaust ports 8, which can also be considered primary and secondary vacuum chambers. Pressures at these two ports can be switched from low to high, high to low, and alternated so as to cause gas flow in either direction. In order to maintain a differential pressure across the wall of the porous vessel while rotating the vessel, the system comprises a two stage rotary vacuum feed-through 3 with a partially hollowed out shaft 10-11-12-13. This differential pressure also enables feed gas to flow into the porous vessel from the inlet valve assembly 15 by directing flow to enter either into the secondary vacuum chamber through a valve 16 with gas entering into the perforated side of the hollowed rotary shaft 13, or to enter into the primary vacuum chamber 1 through valve 17 with gas flowing across the outer 9 and inner 10 porous walls of the vessel 2. Alternatively, a single inlet and corresponding outlet can be used to allow the gas to flow in one direction. In this case, the conductance of the outer wall 9 and inner wall 10 of the porous vessel 2 may be adjusted to maintain a desired pressure differential between the primary chamber 1 and secondary chamber 5. Adjustment of the conductance may be done by choosing the porosity of the outer wall 9 and inner wall 10, which may be the same or different.

In one aspect of the invention, the section of the hollow rotary shaft 10 within the porous vessel 2 functions both for bi-directional gas transport (to deliver or withdraw reactant/product/purge gases) and to prevent solid particles from entering inside the hollow axial central portion. This section makes a removable or detachable seal with the rotary vessel by a threaded or flanged connection 18. Also, this section of the rotary shaft makes a removable or detachable threaded or flanged connection 19 with another segment of the rotary shaft 12. The purpose for the connection 19 is to enable various types of configurations to be made with segment 13 of the shaft containing openings that permit the flow of gas. Such configurations may include a hollowed tube with a porous wall, a full length straight tube extending the length of the vessel with small perforations, a full length straight tube with small perforations but with a concentric solid cover, a full length straight tube with an opening at the end, or a partial length tube with an opening at the end. This arrangement completes a gas flow circuit from the vessel to a secondary vacuum chamber by means of the perforated openings on the surface of the tube or porous segment, wherein the openings 13 or alternatively porous segment are positioned along the length of the tube confined to the region of the secondary vacuum chamber 5.

In another aspect of the invention, a section of the apparatus enables a differential pressure across the porous vessel 2, specifically the primary 1 and secondary 5 vacuum chambers. The primary vacuum chamber 1 encloses the porous vessel 2, with a vacuum outlet 7 and gas feed inlet 17. The outlet consists of an intercepted control valve, with the flow directed toward a vacuum pump. The gas feed inlet to the primary chamber consists of a valve assembly 15 & 17. The secondary vacuum chamber 5 is partitioned from the primary chamber by the left of two rotary vacuum feedthroughs (3). The right rotary feedthough 3 isolates the vacuum of the secondary vacuum chamber 5 from atmosphere. This secondary vacuum chamber 5 is critically essential in the design, as it completes the gas flow circuit through a hollow rotary porous tube 11, connecting the two chambers 1 and 5. The secondary chamber 5 also consists of a vacuum outlet 8 and gas feed inlet 16. The rotary vacuum feedthroughs 3 enable both rotation of the vessel, and a vacuum seal between the primary 1 and secondary 5 chamber and the secondary chamber 5 and the outside atmosphere. Rotational energy may be delivered to the shaft by an external belt drive connected to the pulley 4. Alternatively, a direct drive may be used or any other suitable connection between the shaft and a motor.

The portion of the assembly containing the axially concentric porous tubes is heated to provide thermal driving force for the ALD reaction. Heat may be applied by resistance heaters, induction heat, or radiant heat, but preferably by resistance heaters that provide process temperatures in the range of 100 to 350° C. Other portions of the assembly, e.g., vacuum lines and precursor supply lines, may be heated to prevent condensation of reactants (chemical precursors or co-reactants). The design is quite general, in that it anticipates that various types of precursors (e.g., metalorganics, metal halides, etc.) and various types of co-reactants, including oxidizers (e.g., water, ozone, amines, etc.) and reducing gasses (hydrogen, carbon monoxide, etc.) may be used. Materials of construction are chosen for compatibility with the reactants. Materials of construction may include aluminum, stainless steel or corrosion resistant materials like Hastalloy™. The latter material is preferred for highly corrosive processes that involve halides.

The present invention may be used to create a variety of core-shell particle structures. In each case, the precursors and co-reactants may be chosen to create a metal, metalloid, oxide, nitride, or polymer shell on a metal, metalloid, oxide, nitride, or polymer core. In addition, nano-laminated shells may be produced, e.g. one type of oxide layer interleaved with other layers. The layers may be multicomponent oxides, metals, metalloids, or nitrides. The particles may be nanoparticles, mircoparticles, or macroparticles with diameters between 100 nm-1,000 nm, 1 micron-1000 microns, or 1 mm to 10 mm, respectively. Coatings may be between 1 nm-1000 nm.

The disclosed apparatus may also be used in continuous processes, e.g. CVD. CVD processes may include metalorganic CVD (MOCVD) using metalorganic precursors or CVD using halide precursors and may also include pulsed CVD processes, i.e., CVD processes where one or more reactant flows are modulated as a function of time to separate reactants, similar to ALD, but where the growth mode is not self limiting. The CVD process may be at atmospheric pressure or at reduced pressure.

ALD may be carried out with solid or liquid sources held in bubblers through which a carrier gas is flowed to convey the source to the deposition chamber. The sources may also be delivered as liquids and vaporized. In this case the solid or liquid ALD or CVD precursors may be dissolved in an organic solvent as individual sources or combined together. Key criteria of a solvent system are (1) high boiling point to reduce the chance of flash off of the solvent, (2) high solubility for the compound, (3) low cost. Useful hydrocarbon solvents may include, for example: octane, decane, isopropanol, cyclohexane, ethylcyclohexane, tetrahydrofuran, toluene, and butyl acetate or mixtures comprising these and other organic solvents. Lewis base adducts may also be incorporated as additions to the solvent(s) for beneficial effects on solubility and to prevent possible oligimerization of the precursor molecules. Examples of useful Lewis Bases include polyamines polyethers, crown ethers, and the like. Pentamethylenediamine is one example of a polyamine. Examples of polyethers include various glymes such as mono-, di-, tri-, and tetraglyme. The precursor solution may be delivered to the process via a vaporizer where the precursor is thermally activated to the gas phase and mixed with a carrier gas to introduce it into the chamber. Vaporizers may incorporate an atomizer, fuel injector, a small diameter tube or capillary tube contacting a heated porous element, or other type of direct liquid injection where the liquid is injected into a hot zone and mixed with an inert carrier gas such as $N_2$, Ar, He or the like. Vaporization temperatures may be between 50-230° C. depending on precursor, and flow rates may be from 0.1-5 ml/min with solution molarities from 0.01-0.5 depending on the solubility of the precursor in the solvent and desired molar flow rate.

The apparatus may be used in several modes. In one mode, the reactant gasses are fed into the porous vessel 2 from the primary vacuum chamber 1 outside the porous vessel 2 through the porous outer wall 9 and exhausted through the porous inner wall 10 of the hollow coaxial tube in the center 11 to the secondary vacuum exhaust port 8. In the second mode, the reactant gasses are fed into the porous vessel from the inside through the hollow coaxial tube 11 that has a porous wall 10 inside the porous reaction vessel 2 and exhausted through the primary reactor space 1 and the primary vacuum exit 7. In a third mode, the precursor may flow in one direction, e.g. from outside to inside and the co-reactant flow from the inside to the outside or vice versa. The purge steps that separate the precursor and co-reactant flows may be run in the same directions as the precursor and co-reactants. Alternatively, the purge steps may be run in opposite directions. Typical flow rates are between 50 standard cubic centimeters per minute (sccm) and 1000 sccm. Pulse times may be between 1 second and 1000 seconds depending on flow rate and surface area of the particles. Lower flow rates and smaller particles would require longer dose times than higher flow rates or larger particles. Additionally, stagnant flow conditions may also be introduced into the sequence e.g., the flow of a precursor or co-reactant dose may be interrupted together with the pumping of the system. Additionally, a baffle, comprising a sheet of material which may itself have openings or may be solid, may be placed between the outer wall of the hollow tube 11 and the inner wall of the vessel 2 in order to block line of sight between the two. This may help disperse any gas or vapor evenly throughout the vessel, as well as prevent sudden pressure changes from lifting the solid particles from the inner wall of the vessel to any openings in the hollow tube.

The porous vessel 2 and inner porous tube 11 may be fabricated from stainless steel using powder metallurgical techniques, or of other suitable temperature and chemically stable material. The pore size of the vessel and tube inner and outer walls may be between 1 and 500 microns, more preferably between 5 and 20 microns. The wall thickness may preferably be between 0.1 and 5 mm. The pore size of the inner and outer portions of the vessel may preferably be of the same or different pore sizes. The preferable ratio of volumes of the porous vessel 2 to the primary vacuum chamber 1 may range for 0.95 to 0.1. The ratio of length to diameter of the porous vessel 2 may range from 1 to 10.

Figure 2:
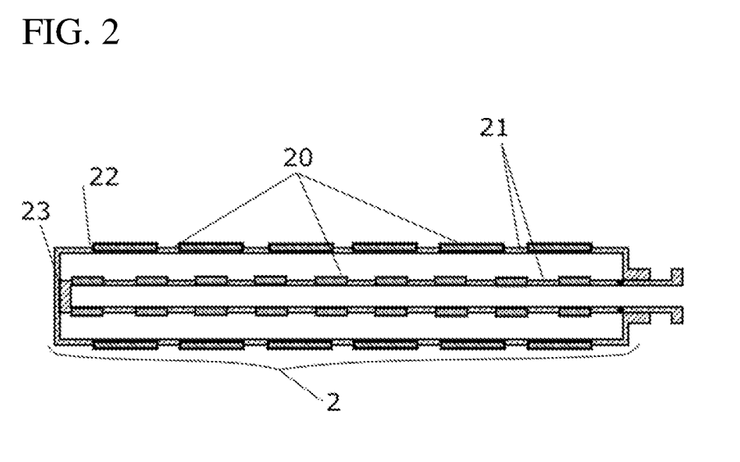
FIG. 2 is a cross section of a porous walled vessel 2 and its inner section containing a plurality of porous elements 20 on the inner and outer walls 21.

As an alternative to a homogenously porous cylindrical vessels, the wall of the porous vessel 2 and inner porous tube may contain a plurality of porous elements 20 distributed about the surface, while the remainder of the surface of the porous vessel or inner porous tube would be fabricated of solid material such as stainless steel, aluminum, or of other suitable temperature and chemically stable material 21 (FIG. 2). Porous elements may be fabricated from stainless steel using powder metallurgical techniques, or from other suitable temperature and chemically stable materials, including ceramics, silicate glasses. The pore size of the elements may be between 1 and 500 microns, more preferably between 5 and 20 microns. The porous element may be a disk, square, or of any other shape that can be mounted or embedded on the wall of the porous vessel and inner porous tube. Elements may be mounted or embedded on the surface of the porous vessel or porous tube by means of a press fit or a spring force clip located at the edge 22 of a porous element. The mounting area of the element may be between 0.25 and 20 cm$^2$. The thickness of the element may be between 0.1 and 5 mm. Porous elements may be distributed randomly or symmetrically about the rotary axis. The inner porous tube 11 may form a rigid contact connection 23 with the solid end of the porous vessel 2 or no connection at all. In the latter case, the end of the tube is sealed.

The rotating vacuum feed-throughs may be sealed by o-rings, ferrofluidic seals, magnetic feed-throughs or gas curtains. Vacuum conditions inside the chambers 5 and 7 may preferably range from 0.1 to 100 Torr, depending on the precursors and co-reactants chosen and may also vary throughout the deposition process. For certain ALD precursors the pressure may be as high as atmospheric pressure, i.e. 760 torr. The rotation of the porous vessel may be chosen for various particle flow regimes, e.g., rolling, slumping, or cascading. The rotation speed may be constant or varied and may also be reversed from time to time. Rotation speeds may vary between 50 and 200 revolutions per minute (r.p.m.).

The following examples show the aspects of various modes of operation:

Example 1—Precursor and Co-Reactant Flow from Outside of Porous Vessel to Inside A quantity of particles are placed inside the inner region of the porous vessel in the concentric space between the inner porous wall 10 and the outer porous wall 9. The porous vessel is 2 placed in the vacuum chamber 1, pumped down to <1 Torr and heated. Rotation is started and maintained at approximately 150 r.p.m. A precursor dose is introduced to the vacuum chamber 1 through valves 15, 17 and maintained for an appropriate length of time to fully saturate the surfaces of the particles. Depending on particle size and quantity this may be between approximately 10-1,000 seconds. A purge dose of inert gas, e.g., nitrogen, is introduced to the vacuum chamber 1 through valves 15, 17 and flow is maintained for approximately 15-100 seconds. A co-reactant dose is introduced into the vacuum chamber 1 through valves 15, 17 and flow is maintained for 10-1,000 seconds. A purge of inert gas is introduced to the chamber 1 through valves 15, 17 and maintained for approximately 15-100 seconds. This sequence is repeated until the desired coating thickness is obtained. Pressure during the run is maintained at approximately 1 Torr in the primary vacuum chamber 1, <1 Torr to 0.9 Torr in the region between the outer porous wall 9 and the inner porous wall 10 of the porous vessel 2, and <0.9 Torr inside the hollow shaft 11 and secondary vacuum chamber 5.

Example 2—Precursor and Co-Reactant Flow from Inside of Porous Vessel to Outside A quantity of particles are placed inside the inner region 6 of the porous vessel 2 in the concentric space between the inner porous wall 10 and the outer porous wall 9. The porous vessel 2 is placed in the vacuum chamber 1, pumped down to <1 Torr and heated. Rotation is started and maintained at approximately 150 revolutions per minute (r.p.m.). A precursor dose is introduced to the inner hollow tube 11 leading to the inner wall 10 of the porous vessel and maintained for an appropriate length of time to fully saturate the surfaces of the particles. Depending on particle size and quantity this may be between approximately 10-1,000 seconds. A purge dose of inert gas, e.g., nitrogen, is introduced to the inner tube 11 leading to the inner wall 10 of the porous vessel 2 and flow is maintained for approximately 15-100 seconds. A co-reactant dose is introduced into the inner tube 11 leading to the inner wall 10 of the porous vessel 2 and flow is maintained for approximately 10-1,000 seconds. A purge of inert gas is introduced to the inner tube 11 leading to the inner wall 10 of the porous vessel and maintained for approximately 15-100 seconds. This sequence is repeated until the desired coating thickness is obtained. Pressure during the run is maintained at approximately 1 Torr. Pressure inside the hollow tube 11 and secondary vacuum chamber 5 is 1 Torr, <1 Torr-0.9 Torr in the region between the inner porous wall 10 and the outer porous wall 9, and <0.9 Torr in the primary vacuum chamber 1.

Example 3—Reversing Flow

A quantity of particles are placed inside the inner region of the porous vessel 6 in the concentric space between the inner porous wall 10 and the outer porous wall 9. The porous vessel 2 is placed in the primary vacuum chamber 1, pumped down to <1 Torr and heated. Rotation is started and maintained at approximately 150 revolutions per minute (r.p.m.). A precursor dose is introduced to the primary vacuum chamber 1 through valves 15,17 and maintained for an appropriate length of time to fully saturate the surfaces of the particles. Depending on particle size and quantity this may be between approximately 10-1,000 seconds. A purge dose of inert gas, e.g., nitrogen, is introduced to the secondary vacuum chamber 5 through valves 15,16 to the inner tube 11 leading to the inner wall 10 of the porous vessel 2 and flow is maintained for approximately 15-100 seconds. A co-reactant dose is introduced into the primary vacuum chamber 1 through valves 15,17 and flow is maintained for approximately 10-1,000 seconds. A purge of inert gas is introduced to the secondary vacuum chamber 5 through valves 15,16 to the inner tube 11 leading to the inner wall 10 of the porous vessel 2 and maintained for approximately 15-100 seconds. This sequence is repeated until the desired coating thickness is obtained. Pressure during the run is maintained at approximately 1 Torr. During the precursor and co-reactant steps, pressure in the primary vacuum chamber 1 is 1 Torr, <1 Torr to 0.9 Torr in the region between the outer porous wall 9 and the inner porous wall 10 of the porous vessel 2, and <0.9 Torr inside the hollow shaft 11 and secondary vacuum chamber 5. During the purge steps, pressure inside the hollow tube 11 and secondary vacuum chamber 5 is 1 Torr, <1 Torr-0.9 Torr in the region between the inner porous wall 10 and the outer porous wall 9, and <0.9 Torr in the primary vacuum chamber 1.

Example 4—Pressure Modulation

A quantity of particles are placed inside the inner region 6 of the porous vessel in the concentric space between the inner porous wall 10 and the outer porous wall 9. The porous vessel 2 is placed in the vacuum chamber, pumped down to <1 Torr and heated. Rotation is started and maintained at approximately 150 revolutions per minute (r.p.m.). A precursor dose is introduced to the primary vacuum chamber 1 through valves 15, 17 and maintained for an appropriate length of time to fully saturate the surfaces of the particles.

Depending on particle size and quantity this may be between approximately 10-1,000 seconds. The primary vacuum chamber 1 is then evacuated. A purge dose of inert gas, e.g., nitrogen, is introduced to the primary vacuum chamber 1 through valves 15,17 and flow is maintained for approximately 10-1000 seconds. A co-reactant dose is introduced into the primary vacuum chamber 1 through valves 15,17 and flow is maintained for approximately 10-1000 seconds. The primary vacuum chamber 1 is then evacuated. A purge of inert gas is introduced to the primary vacuum chamber 1 through valves 15,17 and maintained for approximately 10-1000 seconds. This sequence is repeated until the desired coating thickness is obtained. Pressure during the run may vary from approximately 0.1 to 1 Torr.

Example 5—Solid Oxide Fuel Cell (SOFC) Cathode Particle Coated with GDC

Lanthanum Strontium Cobalt Iron oxide (LSCF) particles are coating with gadolinium doped ceria (GDC) using an apparatus and method similar to those described in Examples 1-4. The GDC precursors are cyclopentadienyls, e.g., $Ce(iPrCp)_3$ and $Gd (iPrCp)_3$, iPr=isopropyl, Cp=cyclopentadienyl as described in U.S. patent application Ser. No. 15/209,747 (taking priority from Provisional 62/192,033) "SURFACE MODIFIED SOFC CATHODE PARTICLES AND METHODS OF MAKING SAME." Process pressure is approximately 1 Torr. The precursors are dissolved in a hydrocarbon solvent such as octane or toluene and delivered to the reaction chamber via vaporization. The process temperature is between 200-240° C. Ten to twenty ALD cycles are used to deposit the GDC film on the LSCF particles.

Example 6—SOFC Cathode Particle Coated with GDC

Lanthanum Strontium Cobalt Iron oxide (LSCF) particles are coating with gadolinium doped ceria (GDC) using an apparatus and method similar to those described in Examples 1-4. The GDC precursors are cyclopentadienyls, e.g., $Ce(R-Cp)_3$ and $Gd (R-Cp)_3$, R=H, $CH_3$, $C_2H_5$, $C_3H_7$, as described in U.S. patent application Ser. No. 15/209,747 (taking priority from Provisional 62/192,033) "SURFACE MODIFIED SOFC CATHODE PARTICLES AND METHODS OF MAKING SAME." Process pressure is approximately 1 Torr. The precursors are dissolved in a hydrocarbon solvent such as octane or toluene and delivered to the reaction chamber via vaporization. The process temperature is between 200-240° C. Ten to twenty ALD cycles are used to deposit the GDC film on the LSCF particles.

Example 7—SOFC Cathode Coated with CDZ

Lanthanum Strontium Cobalt Iron oxide (LSCF) particles are coating with cobalt doped zirconia (CDZ) using an apparatus and method similar to those described in Examples 1-4. The CDZ precursors are Co amidinate and Zr amides (e.g., $Zr(NMe_2)_4$, $Zr(NEt_2)_4$, $Zr(NEtMe)_4$, $Me=CH_3$, $Et=C_2H_5$, as described in U.S. Provisional Patent Application 62/265,076 "Dual Conductor Surface Modified Cathode Particles and Method of Making Same." Process pressure is approximately 1 Torr. The precursors are dissolved in a hydrocarbon solvent such as octane or toluene and delivered to the reaction chamber via vaporization. The process temperature is between 200-240° C. Ten to twenty ALD cycles are used to deposit the CDZ film on the LSCF particles.

Example 8—SOFC Cathode Particle Coated with CDH

Lanthanum Strontium Cobalt Iron oxide (LSCF) particles are coating with cobalt doped hafnia (CDH) using an apparatus and method similar to those described in Examples 1-4. The CDH precursors are Co amidinate and Zr amides (e.g., $Hf(NMe_2)_4$, $Hf(NEt_2)_4$, $Hf(NEtMe)_4$, $Me=CH_3$, $Et=C_2H_5$, as described in U.S. Provisional Patent Application 62/265,076 "Dual Conductor Surface Modified Cathode Particles and Method of Making Same." Process pressure is approximately 1 Torr. The precursors are dissolved in a hydrocarbon solvent such as octane or toluene and delivered to the reaction chamber via vaporization. The process temperature is between 200-240° C. Ten to twenty ALD cycles are used to deposit the CDZ film on the LSCF particles.

Example 9—SOFC Cathode Particle Coated with GDC

Lanthanum Strontium Cobalt Iron oxide (LSCF) particles are coating with gadolinium doped ceria (GDC) using an apparatus and method similar to those described in Examples 1-4. The GDC precursors are alkoxides, e.g., $Ce(mmp)_4$ and $Gd (mmp)_4$, mmp=1-methoxy-2-methyl-2-propanolate, as described in "MOCVD and ALD of $CeO_2$ Thin Films with a Novel Monomeric $Ce^{IV}$ Alkoxide Precursor". Process pressure is approximately 1 Torr. The precursors are dissolved in a hydrocarbon solvent such as octane or toluene and delivered to the reaction chamber via vaporization. The process temperature is between 200-240° C. Ten to twenty ALD cycles are used to deposit the GDC film on the LSCF particles.

Example 10—Alumina Coated with Ce-Doped $TiO_2$

Alumina particles are coated with $TiO_2$ with 1-5 at % $CeO_2$ using an apparatus and method similar to those described in Examples 1-4. The Ti precursor is $Ti(NMe_2)_4$, $Me=CH_3$. Ce precursors are cyclopentadienyls, e.g. $Ce(iPrCp)_3$. The precursors are dissolved in a hydrocarbon solvent such as octane or toluene and delivered to the reaction chamber via vaporization. The process temperature is between 200-240° C. Ten to twenty ALD cycles are used to deposit the Ce-doped $TiO_2$ film on the alumina particles.

Example 11—Alumina Coated with Ce-Doped $TiO_2$

Porous alumina particles are coated with $TiO_2$ with 1-5 at % $CeO_2$ using an apparatus and method similar to those described in Examples 1-4. The Ti precursor is $Ti(NMe_2)_4$, $Me=CH_3$. Ce precursors are cyclopentadienyls, e.g. $Ce(iPrCp)_3$. The precursors are dissolved in a hydrocarbon solvent such as octane or toluene and delivered to the reaction chamber via vaporization. The process temperature is between 200-240° C. Ten to twenty ALD cycles are used to deposit the Ce-doped $TiO_2$ film on the alumina particles.

Example 12—Alumina Coated with Ce-Doped $TiO_2$

Alumina particles are coated with $TiO_2$ with 1-5 at % $CeO_2$ using an apparatus and method similar to those described in Examples 1-4. The Ti precursor is $Ti(NMe_2)_4$, Me=$CH_3$. Ce precursors are alkoxides, e.g. $Ce(mmp)_4$. The precursors are dissolved in a hydrocarbon solvent such as octane or toluene and delivered to the reaction chamber via vaporization. The process temperature is between 200-240° C. Ten to twenty ALD cycles are used to deposit the Ce-doped $TiO_2$ film on the alumina particles.

Example 13—Alumina Coated with Ce-Doped $TiO_2$

Porous alumina particles are coated with $TiO_2$ with 1-5 at % $CeO_2$ using an apparatus and method similar to those described in Examples 1-4. The Ti precursor is $Ti(NMe_2)_4$, Me=$CH_3$. Ce precursors are alkoxides, e.g. $Ce(mmp)_4$. The precursors are dissolved in a hydrocarbon solvent such as octane or toluene and delivered to the reaction chamber via vaporization. The process temperature is between 200-240° C. Ten to twenty ALD cycles are used to deposit the Ce-doped $TiO_2$ film on the alumina particles.

Example 14—Alumina Coated with Ce-Doped $TiO_2$

Alumina particles 1-4 mm in diameter and 2-10 mm long. with pores in the 7-9 nm range and a surface area of 250-260 $m^2/g$ are coated with $TiO_2$ with 1-5 at % $CeO_2$ using an apparatus and method similar to those described in Examples 1-4. The Ti precursor is $Ti(NMe_2)_4$, Me=$CH_3$. Ce precursors are alkoxides, e.g. $Ce(mmp)_4$. The precursors are dissolved in a hydrocarbon solvent such as octane or toluene and delivered to the reaction chamber via vaporization. The process temperature is between 200-240° C. Ten to twenty ALD cycles are used to deposit the Ce-doped $TiO_2$ film on the alumina particles.

It is noted that various combinations not directly listed above may be used and are in no way limiting, and that other embodiments may be envisioned by one skilled in the art. As an example, the apparatus may be configured with a single outlet in either the primary vacuum chamber 1 or the secondary vacuum chamber 5. Different methods may be used to affix the primary vacuum chamber 1 to the secondary vacuum chamber 5, e.g., a polymeric o-ring or metal gasket with bolts or quick disconnects.

What is claimed is:

1. An apparatus for efficiently coating the surface of bulk quantities of solid particles, comprising:
    a) a generally horizontally oriented rotating porous walled vessel, which contains the solid particles, and an inner hollow tube generally coaxial with the rotation axis of the vessel, the hollow tube having a first portion inside the vessel and a second portion that extends outside the vessel,
    b) a continuous gas flow path between the outside of the porous walled vessel and the inside of the hollow tube through an opening in the first portion of the hollow tube, wherein a pressure differential between the outside of the porous walled vessel and the inside of the hollow tube causes gas to flow between the outside of the porous walled vessel and the inside of the hollow tube
    c) the porous vessel being positioned within a primary vacuum chamber such that the hollow tube is connected to and contains an opening to a secondary vacuum chamber, wherein the apparatus transfers gas between the primary vacuum chamber and the secondary vacuum chamber, thereby causing the gas to pass and contact the solid particles.

2. The apparatus of claim 1, wherein the porous vessel is used to contain and agitate the solid particles during atomic layer deposition of a layer on the solid particles, further wherein the vessel is affixed to the hollow tube and is generally horizontally rotated by the hollow tube, further wherein a gas flows into the hollow tube and is thereby delivered through the opening in the first portion of the hollow tube into the vessel, the gas thereby flowing due to the pressure differential out through the porous wall of the vessel to a primary vacuum chamber, where the gas is finally pumped away from the primary vacuum chamber.

3. The apparatus of claim 1, wherein the second portion of the hollow tube completes a gas flow circuit from the vessel to a secondary vacuum chamber by means of perforated openings in the first portion of the hollow tube, wherein the openings are specifically positioned along the length of the first portion of the hollow tube exclusively in the region of the secondary vacuum chamber.

4. The apparatus of claim 1, wherein the hollow tube connects to the porous vessel in a removable manner by means of a flanged or threaded connection, wherein when the hollow tube is removed from the vessel at the connection, the solid particles can be loaded into the vessel; furthermore, wherein the hollow tube removably connects to an adjacent section of the hollow tube by means of a threaded or flanged connection.

5. The apparatus of claim 1, wherein various opening types are made in the first portion of the hollow tube, including pores in the walls of the tube, or perforations in the tube, or elements in walls of the tube, the elements having porous sections.

6. The apparatus of claim 5, wherein a baffle between the outer wall of the first portion of the hollow tube and the inner wall of the vessel, comprising a sheet of material between the hollow tube and the inner wall of the vessel, at least partially blocks line of sight between the outer wall of the hollow tube and the inner wall of the vessel.

7. The apparatus of claim 1, comprising the porous vessel connected to the hollow tube, wherein the hollow tube is connected to an external driver shaft, which delivers rotational motion to the vessel.

8. The apparatus of claim 1, further comprising the porous vessel and hollow tube, wherein the primary and secondary vacuum chambers are connected by the hollow tube, such that a differential pressure can be maintained between the primary and secondary vacuum chambers and the hollow tube passes between the primary and secondary vacuum chambers by means of a rotary feedthrough mechanism; and furthermore, that the secondary vacuum chamber is isolated from ambient atmosphere by an additional rotary feedthrough mechanism.

9. The apparatus of claim 1, further comprising a primary vacuum chamber connected to a primary exhaust port and a secondary vacuum chamber connected to a secondary exhaust port, wherein, the primary and secondary exhaust ports are connected to either primary and secondary throttle valves connected to a vacuum pump, or primary and secondary vacuum pumps; which are thereby used to adjust the pressure within each of the primary and secondary chambers, and thereby the pressure differential.

10. The apparatus of claim 1, further comprising primary and secondary vacuum chambers, wherein each chamber is connected to a gas inlet by means of a three way valve assembly, which enables the gas to flow into the primary or secondary vacuum chamber.

11. The apparatus of claim 1, wherein the porous vessel is made of stainless steel, ceramic, or plastic.

12. The apparatus of claim 10, with the vessel comprising pores with pore sizes from 1 to 100 microns.

13. The apparatus of claim 10, with vessel wall thicknesses of 1 to 6 mm.

14. The apparatus of claim 10, with vessel diameter of 25 mm to 1 m.

15. The apparatus of claim 10, with vessel length of 100 mm to 5 m.

16. The apparatus of claim 1, comprising rotary feedthroughs, wherein the feed-throughs maintain a differential pressure between the primary and secondary vacuum chambers of 0.1 to 100 Torr.

17. A method for coating particles using differential pressure across two axially concentric tubes, comprising the steps of; attaching a hollow tube approximately concentrically inside a vessel having porous walls, providing an opening between the hollow tube and the inside of the vessel, placing particles inside the vessel, placing the vessel inside a primary vacuum chamber, connecting the hollow tube to a secondary vacuum chamber via an opening, connecting the hollow tube to a rotary feedthrough, rotating the hollow tube and thereby the vessel, and establishing a gas flow and pressure differential between the primary vacuum chamber and the secondary vacuum chamber thereby contacting the gas with the particles.

18. The method of claim 17, wherein precursor dose, purge, and coreactant gases flow into the vessel from the primary vacuum chamber, and are withdrawn from the vessel through the hollow tube into the secondary vacuum chamber, which is held at a lower pressure with respect to the primary vacuum chamber.

19. The method of claim 17, wherein precursor, purge, and coreactant gases flow into the vessel from the secondary vacuum chamber, and are withdrawn from the vessel through the porous wall of the vessel into the primary vacuum chamber, which is held at a lower pressure with respect to the secondary vacuum chamber.

20. The method of claim 17, wherein precursor, purge, or coreactant gases are interrupted after flowing into the vessel from the primary vacuum chamber and pumping of the primary vacuum chamber is also interrupted, allowing the primary vacuum chamber to increase to a certain pressure, and the precursor dose, purge, or coreactant gases are then withdrawn from the vessel through the hollow tube into the secondary vacuum chamber.

21. The method of claim 17, wherein precursor, purge, or coreactant gases are interrupted after flowing into the vessel from the secondary vacuum chamber and the pumping is also interrupted, allowing the secondary vacuum chamber to increase to a certain pressure, and are then withdrawn from the vessel through the porous wall of the vessel into the primary vacuum chamber.

22. The method of claim 17, wherein the precursor, purge, and coreactant gasses are separated and flowed alternately in a deposition sequence, and by adjusting gas flows and pumping from the primary vacuum chamber and the secondary vacuum chamber the flow directions of the precursor, purge and coreactant gases are alternated in flow direction flowing from the secondary vacuum chamber to the primary vacuum chamber or flowing from the primary vacuum chamber to the secondary vacuum chamber, thereby alternating flow direction through the porous walls of the vessel.

23. The method of claim 17, wherein a vacuum step and/or a rapid pressure pulse are superimposed during or between the precursor dose, purge, and/or the coreactant doses.

24. The method of claim 16, wherein precursor transport across the porous vessel wall is predominantly achieved via steady state or constant precursor gas flow, and not by diffusion.

25. A cathode powder for solid oxide fuel cells with a core shell structure wherein the shell is deposited using an apparatus described in claim 1.

* * * * *